United States Patent

Brox

(10) Patent No.: US 6,751,130 B2
(45) Date of Patent: Jun. 15, 2004

(54) INTEGRATED MEMORY DEVICE, METHOD OF OPERATING AN INTEGRATED MEMORY, AND MEMORY SYSTEM HAVING A PLURALITY OF INTEGRATED MEMORIES

(75) Inventor: Martin Brox, München (DE)

(73) Assignee: Infineon Technologies AG, Munich (DE)

( * ) Notice: Subject to any disclaimer, the term of this patent is extended or adjusted under 35 U.S.C. 154(b) by 54 days.

(21) Appl. No.: 10/262,172

(22) Filed: Oct. 1, 2002

(65) Prior Publication Data

US 2003/0063506 A1 Apr. 3, 2003

(30) Foreign Application Priority Data

Oct. 1, 2001 (DE) .......................................... 101 48 521

(51) Int. Cl.[7] ................................................ G11C 7/00
(52) U.S. Cl. .......................... 365/189.05; 365/189.01; 365/191; 365/193; 365/189.12
(58) Field of Search ...................... 365/189.01, 189.05, 365/189.12, 191, 193

(56) References Cited

U.S. PATENT DOCUMENTS

| 5,946,245 | A | * | 8/1999 | Brown et al. ................ 365/201 |
| 5,963,502 | A | | 10/1999 | Watanabe et al. |
| 6,032,274 | A | * | 2/2000 | Manning ..................... 714/718 |
| 6,377,512 | B1 | * | 4/2002 | Hamamoto et al. ......... 365/233 |

* cited by examiner

*Primary Examiner*—Viet Q. Nguyen
(74) *Attorney, Agent, or Firm*—Laurence A. Greenberg; Werner H. Stemer; Gregory L. Mayback

(57) ABSTRACT

An integrated memory has a selection circuit for setting a selectable latency—relative to a clock signal between a beginning of a read access and the provision of the data to outside the memory. A detection circuit compares data to be output with desired data and serves for setting the latency depending on the comparison result. The selection circuit receives a control signal, by means of which the latency can be set. In the event of noncorrespondence between the data read out and the desired data, the latency is increased by the detection circuit. This enables an accurate and error-free on-chip setting of a so-called CAS latency for a read-out operation of the memory.

9 Claims, 1 Drawing Sheet

INTEGRATED MEMORY DEVICE, METHOD OF OPERATING AN INTEGRATED MEMORY, AND MEMORY SYSTEM HAVING A PLURALITY OF INTEGRATED MEMORIES

BACKGROUND OF THE INVENTION

Field of the Invention

The present invention relates to an integrated memory, to a method for operating such an integrated memory, and to a method for operating a memory system with a plurality of such integrated memories.

An integrated memory, particularly in the form of a DRAM memory (dynamic random access memory) generally has a memory cell array with word lines and bit lines, at whose crossover points memory cells are arranged. Via the word lines, memory cells to be read are selected and data of the selected memory cells are written to the memory cells or read from the memory cells via connected bit lines.

During the initialization of an SDRAM memory (synchronous DRAM), a so-called mode register set command is usually applied, by means of which a corresponding mode register is written to. The latter is used in order to define a specific operating mode of the SDRAM. By way of example, a burst length, a burst type, a so-called CAS latency and an operating mode of the memory are defined by means of the mode register (CAS, column access strobe, column address signal).

The CAS latency generally defines the number of clock cycles of a clock signal which is provided between the beginning of the read access and the beginning of data outputting to outside the memory. The CAS latency thus indicates the number of clock cycles after which the data are available after a read access on an external bus. This so-called read CAS latency is thus a value—relative to a clock signal—for a latency time between the beginning of the read access and the beginning of data outputting to outside the memory. During a read access, a data packet is obtained on the bus at a defined instant. In this case, the CAS latency is generally programmed and set depending on the operating frequency of the memory in order to obtain an optimum data throughput at every operating frequency during a read access to one of the memory cells.

In a standard SDRAM memory, the CAS latency can generally be programmed between values of two and three clock periods. This value is stored in the mode register. If the memory is operated at a comparatively low operating frequency, the CAS latency can assume both values. For the case where the operating frequency of the clock and thus of the memory is increased, the situation can occur wherein the memory no longer operates reliably with a CAS latency of two clock periods since, under certain circumstances, the data outputting to outside the memory begins before the data are present at the output driver. In this case, it is necessary to program the memory with a CAS latency of three clock periods. This programming is carried out in a system start, for example. In this case, errors may arise during the programming, so that there is the risk of the memory not operating in a manner free from errors in later operation.

SUMMARY OF THE INVENTION

It is accordingly an object of the invention to provide an integrated memory, which overcomes the above-mentioned disadvantages of the heretofore-known devices and methods of this general type and which enables a comparatively accurate and error-free setting of a value for a CAS latency for a read-out operation of the memory. It is a further object of the present invention to specify a method for operating such a memory and a method of operating a memory system having a plurality of such memories.

With the foregoing and other objects in view there is provided, in accordance with the invention, an integrated memory, comprising:

an output driver for outputting data;

a selection circuit connected to the output driver, the selection circuit having a control input for receiving a control signal for setting a selectable latency, relative to a clock signal, between a beginning of a read access and an outputting of the data to outside the memory, the selection circuit, depending on a selected latency, forwarding the data to be output to the output driver at different instants relative to the beginning of the read access;

a detection circuit for comparing the data to be output with desired data, the detection circuit having an output connected to the control input of the selection circuit for outputting an output signal for setting the selected latency depending on a comparison result.

In accordance with an added feature of the invention, the selection circuit has a first input connected to a first data path and a second input connected to a second data path, the first data path outputs the data to be output at a first instant and the second data path outputs the data to be output at a second instant following the first instant, and wherein the first and second inputs are enabled alternatively to one another by the selection circuit.

In accordance with an additional feature of the invention, clock-controlled multivibrators for receiving the data to be output are connected in the first and second data paths. The second data path has a higher number of the multivibrators than the first data path. Preferably, the detection circuit is connected to an input of one of the multivibrators.

In accordance with another feature of the invention, a register circuit stores a value of the latency. The register circuit is connected between the control input of the selection circuit and the output of the detection circuit. In a preferred embodiment, the register circuit has an output through which the value of the latency can be read out to the outside of the memory.

With the above and other objects in view there is also provided, in accordance with the invention, a memory processing method, which comprises:

providing an integrated memory as summarized above, and operating the memory by:
in a write mode, writing data to the memory to form stored data;
subsequently, in a read mode, reading out the stored data, and comparing the data being read out with desired data in the detection circuit; and
if the data being read out and the desired data do not correspond, increasing the latency with the detection circuit.

In accordance with a concomitant feature of the invention, the write mode and the read mode proceed in an initialization operating mode of the memory.

With the above and other objects in view there is also provided, in accordance with the invention, a method for operating a memory system, which comprises:

providing at least two of the above-summarized integrated memories;

operating each of the integrated memories in an initialization operating mode, by:
  in a write mode, writing data to be stored to the respective memory;
  afterward, for each memory, in a read mode, reading out the stored data and comparing the data being read out with desired data in the detection circuit of the respective memory;
  if the data read out and the desired data do not correspond, increasing the latency by the detection circuit; and
if the latencies of the memories do not correspond to one another:
  operating the memory having a smaller latency with an increased clock frequency in a further initialization operating mode and increasing the latency thereof; or
  operating the memory system with different latencies.

In other words, the integrated memory according to the invention has a selection circuit having a control input for receiving a control signal, which serves for setting a selectable latency (CAS latency)—relative to a clock signal—between the beginning of a read access and the provision of the data to outside the memory. Depending on the selected latency, data to be output are forwarded to an output driver by the selection circuit at different instants relative to the beginning of the read access. A detection circuit serves for comparing the data to be output with desired data and has an output for outputting an output signal, by means of which the latency can be set depending on the comparison result. The control input of the selection circuit is coupled to the output of the detection circuit.

The integrated memory according to the invention makes it possible to set an optimum value for the CAS latency on-chip in a self-adjusting manner. This enables a comparatively accurate and error-free setting of the CAS latency. Therefore, it is no longer necessary to store a corresponding item of information on a memory module (DIMM module), for example, by means of a programming that is performed externally. As a result, programming errors which can lead to the failure of the memory chip are effectively avoided. Moreover, the self-adjusting setting of the CAS latency largely avoids a programming of CAS latency that is deliberately or else not deliberately incorrect, for the purpose of a higher performance of the memory chip. This in turn increases the reliability of a memory system.

In a development of the integrated memory according to the invention, a register circuit for storing a value of the CAS latency is provided, which is connected between the control input of the selection circuit and the output of the detection circuit. By way of example, the CAS latency is determined in test operation or in an initialization operation mode and stored long term for normal operation of the memory in the register circuit. In an advantageous embodiment, the register circuit can be read by means of an applied read command, that is to say it has an output via which the value of the CAS latency can be read out to outside the memory.

The latency between the beginning of the read access and the beginning of data outputting is set as follows in accordance with the method according to the invention. In a write mode, data to be stored are written to the memory. After that, in a read mode, the stored data are read out, the data read out being compared with desired data in the detection circuit. A specific latency is preset at this instant. For the case where the corresponding data path is fast enough, so that the data to be read out are present at the output driver after the CAS latency has elapsed, the data to be read out correspond to the desired data. However, if the CAS latency is chosen to be too small, the data read out from the previous read access are still present at the detection circuit, and do not correspond to the desired data. In the event of noncorrespondence between the data read out and the desired data, the CAS latency is increased by the detection circuit.

In a memory system according to the invention, a plurality of integrated memories according to the invention are operated in the memory system. The memory system is operated with a specific operating frequency in an initialization operating mode. The optimum CAS latency is determined, as described above, in each of the memories of the memory system. If the data read out do not correspond to the desired data in the case of one or more of the memories, the CAS latency of the corresponding memory is increased by the respective detection circuit. The corresponding values of the CAS latencies of each memory are subsequently read out from the corresponding register, for example, to the outside.

For the case where the latencies of the memories correspond, a controller connected to the memory system takes the corresponding value as a basis for controlling normal operation of the memory system. For the case where the latencies of the memories deviate from one another, a plurality of alternatives are taken into consideration. In a first case, the controller controls the memory system in such a way that read accesses are made to the different memories with correspondingly different CAS latencies. In this case, the controller must ensure that individual read accesses to the different memories do not collide with one another.

As an alternative to such a mode of operation, a second initialization operation of the memory system is carried out. In this initialization operating mode, those memories which have a smaller CAS latency compared with the others are operated with an increased clock frequency. What is instigated for a memory operated in this way is that the associated detection circuit increases the CAS latency. In normal operation, however, the memory system is operated with an operating frequency in accordance with the first initialization operating mode. As a result, all the memories of the memory system are now operated with corresponding CAS latencies.

Other features which are considered as characteristic for the invention are set forth in the appended claims.

Although the invention is illustrated and described herein as embodied in a integrated memory and methods for operating an integrated memory and a memory system having a plurality of integrated memories, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
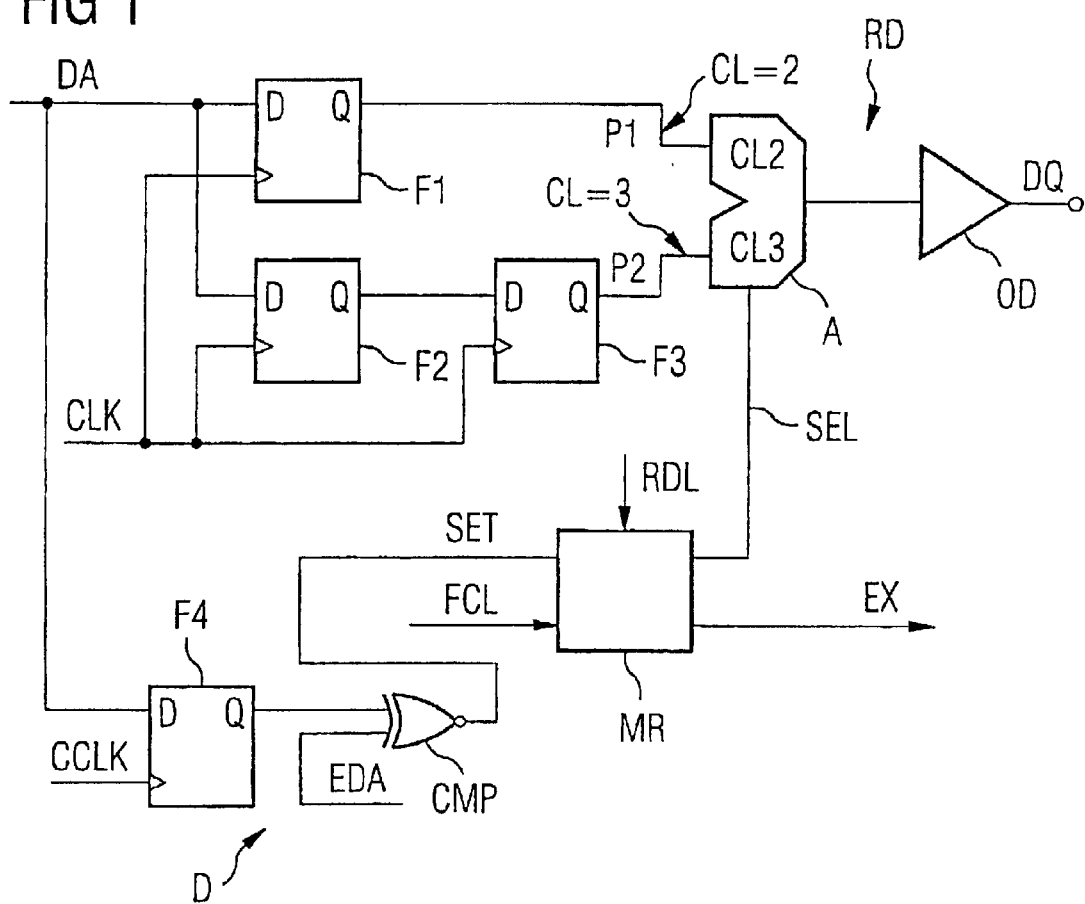
FIG. 1 is a block diagram of an embodiment of an integrated memory according to the invention with a selection circuit for setting a CAS latency and with a detection circuit.

Referring now to the figures of the drawing in detail and first, particularly, to FIG. 1 thereof, there is shown an embodiment of an integrated memory according to the invention. An output driver OD outputs data stored in the memory. The output driver OD is connected to a data terminal DQ. The input of the output driver OD is connected to an output of a selection circuit A. An input CL2 of the selection circuit A is connected to a first data path P1. An input CL3 of the selection circuit A is connected to a second data path P2. The first data path P1 has a clock-controlled multivibrator F1 in the form of a D-type flip-flop. By contrast, the second data path P2 has two clock-controlled multivibrators F2 and F3 likewise in the form of D-type flip-flops which are connected in series. The flip-flops are controlled by a clock signal CLK. The flip-flops F1 to F3 receive data DA to be read out present on a main data path of the memory, for example an internal data bus. The flip-flops F1 to F3 are controlled here by clock edges.

In the selection circuit A, which is embodied as a multiplexer circuit, for example, the inputs CL2 and CL3 are enabled alternatively to one another depending on a set CAS latency. With the first data path P1, the data DA are output with a CAS latency CL=2. Via the second data path P2, the data DA are output with a CAS latency of CL=3. Depending on the CAS latency with which the memory is intended to be operated, either the input CL2 or the input CL3 of the selection circuit A is enabled. In this case, the CAS latency specifies the number of clock cycles of the clock signal CLK which are awaited relative to the beginning of a read access by means of the read command RD in order to read out the data DA. A CAS latency CL=2 means that two clock cycles of the clock signal CLK are awaited from the beginning of the read access until data outputting; a CAS latency CL=3 means that three clock cycles of the clock signal CLK are awaited until data outputting.

Figure 2:
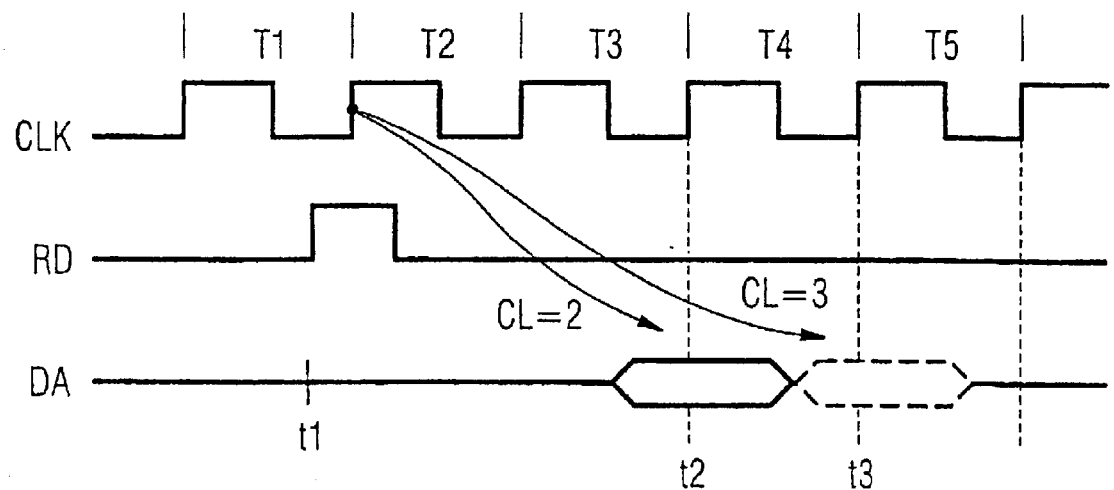
FIG. 2 is a timing diagram with signals in accordance with FIG. 1.

This is represented in more detail for illustration purposes in FIG. 2 using a signal timing diagram. The clock signal CLK has the clock periods T1 to T5. At a time instant t1, the read command RD is activated. For the case where the data path P1 is enabled, the data DA to be read out are forwarded to the output driver OD at a time instant t2 at the beginning of the clock period T4. By contrast, if the data path P2 is enabled, the data DA, as indicated by broken lines, would be forwarded to the output driver OD at the instant t3 at the beginning of the clock period T5. In both cases, the data DA at the inputs of the flip-flops F1 and F2, respectively, already have a time delay of about one clock period from the beginning of the read access.

Thus, under the control of the selection circuit A, depending on the set CAS latency, the data DA to be output are forwarded to the output driver at different instants t2 and t3 relative to the beginning of the read access. A detection circuit D serves for comparing the data DA to be read out with desired data EDA. The data DA are present at a D-type flip-flop F4, which is controlled by a clock signal CCLK. The flip-flop F4 switches the data DA to a comparison unit CMP, at which the desired data EDA are additionally present. The comparison unit CMP is in this case embodied in the form of an XNOR gate. Furthermore, a register circuit MR for storing a value of the CAS latency is provided, which is connected between a control input of the selection circuit A and the output of the detection circuit D. The CAS latency can be set by way of a control signal SEL of the register circuit MR. If the signal SEL has the state SEL="1", for example, then the input CL2 of the selection circuit A is enabled. Conversely, for the case where SEL="0", the input CL3 and thus the data path P2 are enabled.

As already described, the data DA are compared with the desired data EDA in the comparison unit CMP. For the case where the internal data path of the memory is fast enough for a CAS latency CL=2, the data DA read out at the output of the flip-flop F4 correspond to the desired data EDA. In that case, an output signal SET="1" is output. This signal states that the CAS latency CL=2 is to remain set and is correspondingly stored in the register MR. For the case where the internal data path of the memory is not fast enough, the data read out from the previous read cycle are still present at the output of the flip-flop F4, and do not correspond to the desired data EDA. Accordingly, a signal SET="0" is written to the register MR. As a result, a CAS latency CL=3 is set. With control by the clock signal FCL, the control signal SEL is applied to the selection circuit A. The register circuit MR can also be read to outside the memory via a terminal EX by means of a read command RDL. The flip-flops shown can also be operated with a common clock signal or each flip-flop individually with a separate clock signal.

The described setting of the CAS latency of the memory is carried out in an initialization operation, for example. To that end, in a write mode, data to be stored are written to the memory, and are additionally stored as desired data. Afterward, in a read mode, the information written in is read out again, the data read out being compared with the corresponding desired data in the detection circuit D. Depending on the state of the signal SET, the set CAS latency is maintained or increased.

I claim:

1. An integrated memory, comprising:
   an output driver for outputting data;
   a selection circuit connected to said output driver, said selection circuit having a control input for receiving a control signal for setting a selectable latency, relative to a clock signal, between a beginning of a read access and an outputting of the data to outside the memory, said selection circuit, depending on a selected latency, forwarding the data to be output to said output driver at different instants relative to the beginning of the read access;
   a detection circuit for comparing the data to be output with desired data, said detection circuit having an output connected to said control input of said selection circuit for outputting an output signal for setting the selected latency depending on a comparison result.

2. The integrated memory according to claim 1, wherein said selection circuit has a first input connected to a first data path and a second input connected to a second data path, the first data path outputs the data to be output at a first instant and the second data path outputs the data to be output at a second instant following the first instant, and wherein the first and second inputs are enabled alternatively to one another by said selection circuit.

3. The integrated memory according to claim 2, which comprises a plurality of clock-controlled multivibrators for receiving the data to be output connected in said first and second data paths, said second data path having a higher number of said multivibrators than said first data path.

4. The integrated memory according to claim 3, wherein said detection circuit is connected to an input of one of said multivibrators.

5. The integrated memory according to claim 1, which comprises a register circuit for storing a value of the latency, said register circuit being connected between said control input of said selection circuit and said output of said detection circuit.

6. The integrated memory according to claim 5, wherein said register circuit has an output for reading out the value of the latency to outside the memory.

7. A memory processing method, which comprises:

providing an integrated memory according to claim 1, and operating the memory by:
- in a write mode, writing data to the memory to form stored data;
- subsequently, in a read mode, reading out the stored data, and comparing the data being read out with desired data in the detection circuit; and
- if the data being read out and the desired data do not correspond, increasing the latency with the detection circuit.

8. The method according to claim 7, wherein the write mode and the read mode proceed in an initialization operating mode of the memory.

9. A method for operating a memory system, which comprises:

providing at least two integrated memories each according to claim 1;

operating each of the integrated memories in an initialization operating mode, by:
- in a write mode, writing data to be stored to the respective memory;
- afterward, for each memory, in a read mode, reading out the stored data and comparing the data being read out with desired data in the detection circuit of the respective memory;
- if the data read out and the desired data do not correspond, increasing the latency by the detection circuit; and if the latencies of the memories do not correspond to one another, selecting from the following two steps:
- operating the memory having a smaller latency with an increased clock frequency in a further initialization operating mode and increasing the latency thereof; and
- operating the memory system with different latencies.

* * * * *